United States Patent [19]

Vu

[11] Patent Number: 4,914,491

[45] Date of Patent: Apr. 3, 1990

[54] JUNCTION FIELD-EFFECT TRANSISTORS FORMED ON INSULATOR SUBSTRATES

[75] Inventor: Duy-Phach Vu, Taunton, Mass.

[73] Assignee: Kopin Corporation, Taunton, Mass.

[21] Appl. No.: 374,621

[22] Filed: Jun. 29, 1989

Related U.S. Application Data

[63] Continuation of Ser. No. 120,019, Nov. 13, 1987, abandoned.

[51] Int. Cl.$^4$ .................... H01L 29/80; H01L 29/78; H01L 27/12
[52] U.S. Cl. ..................................... 357/22; 357/23.1; 357/23.7; 357/23.9; 357/23.14; 357/4; 357/41
[58] Field of Search ................ 357/22 R, 22 C, 22 D, 357/22 F, 23.1, 23.7, 23.9, 23.14, 4, 41

[56] References Cited

U.S. PATENT DOCUMENTS

| | | | |
|---|---|---|---|
| 3,836,993 | 9/1974 | Joshi | 357/22 R |
| 4,479,846 | 10/1984 | Smith et al. | 156/603 |
| 4,611,220 | 9/1986 | MacIver | 357/22 R |
| 4,700,461 | 10/1987 | Choi et al. | 437/41 |

FOREIGN PATENT DOCUMENTS

| | | | |
|---|---|---|---|
| 3404875 | 8/1985 | Fed. Rep. of Germany . | |
| 56-71982 | 6/1981 | Japan | 357/22 |
| 61-18180 | 1/1986 | Japan | 357/22 I |
| 62-126678 | 6/1987 | Japan | 357/22 |
| WO88/02557 | 4/1988 | World Int. Prop. O. . | |

OTHER PUBLICATIONS

"A Lateral Silicon-on-Insulator Bipolar Transistor with a Self-Aligned Base Contact"; *IEEE Electron Device Letters;* Sturm et al.; vol. EDL-8, No. 3, Mar. 1987; pp. 104–106.

"Silicon-on-Insulator Bipolar Transistors"; *IEEE Electron Device Letters;* Rodder and Antoniadis, vol. EDL-4, No. 6, Jun. 1983, pp. 193–195.

"An SOI Voltage-Controlled Bipolar-MOS Device"; *IEEE Transactions on Electron Devices;* Colinge; vol. ED-34, No. 4, Apr. 1987; pp. 845–849.

Drawing of Device Disclosed to the Inventor while Visiting the University of Wisconsin During Oct. of 1987.

*Primary Examiner*—Andrew J. James
*Assistant Examiner*—Ngan Van Ngo
*Attorney, Agent, or Firm*—Hamilton, Brook, Smith & Reynolds

[57] ABSTRACT

A junction field effect transistor formed on insulator substrates particularly oxide substrates and having a polysilicon vertical control gate region formed of a cross member and two end members orthogonal thereto. The vertical control gate is formed over an n-channel in a Si island, the n-channel is located beneath the cross member, with p+ junction gate regions laterally disposed on either side of the n-channel and n+ drain and gate regions laterally orthogonal thereto in Si island.

8 Claims, 3 Drawing Sheets

| | |
|---|---|
| STEP 1 | FORM SOI SUBSTRATE |
| STEP 2 | ISOLATE Si ISLANDS |
| STEP 3 | FORM OXIDE MASK FILM |
| STEP 4 | CHANNEL ION IMPLANT |
| STEP 5 | DEPOSIT POLYSILICON |
| STEP 6 | DEFINE VERTICAL POLYSILICON CONTROL GATE |
| STEP 7 | ION IMPLANT JUNCTION GATE REGIONS |
| STEP 8 | ION IMPLANT DRAIN AND SOURCE REGIONS |
| STEP 9 | PASSIVATION LAYER |
| STEP 10 | HEAT TREATMENT |
| STEP 11 | FORM CONTACT OPENINGS |
| STEP 12 | FORM METALLIZATION |

Fig. 1

JUNCTION FIELD-EFFECT TRANSISTORS FORMED ON INSULATOR SUBSTRATES

This is a continuation of co-pending application Ser. No. 07/120,019 filed on Nov. 13, 1987 now abandoned.

DESCRIPTION

Background Art

The development of the junction field-effect transistor (JFET) dates back to 1952, when the JFET was first proposed by W. Shockley. The n-JFET comprises, in general, an n-type channel layer and a $p^+$-type gate formed in the n-type layer from the top surface. Contact is made to the $p^+$-region and the two n-regions at either side of the top gate, resulting in respective gate, source and drain contacts. The p-JFET has a p-type channel layer and an $n^+$ gate. In the JFET, the depletion region of a p-n junction is used to modulate the cross-sectional area available for current flow. The current is transported by carriers of one polarity only; hence, it is customary to refer to the field-effect transistor as a unipolar device in contrast to the earlier developed bipolar junction transistor which operates through the injection of minority carriers (*Physics and Technology of Semiconductor Devices*, A. S. Grove, John Wiley & Sons, 1967, p. 243).

More recently, techniques have developed for fabricating devices from thin semiconductor films isolated from a substrate by a buried insulating layer, i.e., slicon o isulator (SOI) substrates.

In the SOI process, a single crystal silicon film is formed on an insulator by zne-mlting and rcrystallization (ZMR) of polycrystalline Si (polysilicon) films formed on an $SiO_2/Si$ body. The polycrystalline Si films are transformed to single crystal films upon recrystallization. (See M.W. Gies et al., "Zone-Melting Recrystallization of Encapsulated Silicon Films on $SiO_2$ - Morphology and Crystallography", *Appl. Phys. Lett.* 40(2), Jan. 15, 1982, pp. 158-160.)

Because the active semiconductor volume of such devices is small and the devices are dielectrically isolated, such SOI devices are less susceptible than bulk silicon devices to logic upset and are latch-up free when formed with CMOS circuits.

In U.S. Pat. No. 4,700,461 issued Oct. 20, 1987 to Choi et al., a process is disclosed for forming n or p-type JFETs from SOI substrates wherein the JFETs are isolated from one another by forming device islands on the $SiO_2$ insulator using the well-known lcal oidation of slicon (LOCOS) planar process. In the Choi et al. process, an n or p-type JFET is formed with a back channel of one type conductivity underlying a channel region of opposite conductivity with a p-n junction formed in the channel region. A polysilicon gate region vertically overlies the p-n junction between an oxide extension region in contact with peripheral edges of the junction. A second region of opposite conductivity is formed below the oxide extension region; and source and drain regions of opposite conductivity extend laterally from peripheral sides of the oxide extension region remote from the channel region.

DISCLOSURE OF THE INVENTION

The invention relates to a method in which JFETs are formed on SOI substrates and the device resulting therefrom. For convenience, an n-JFET is used below to summarize the invention. A p-JFET can be similarly made by reversing the type of conductivity. In the first step of the process, single crystal, or nearly single crystal, Si device regions of the SOI are isolated on the $SiO_2/Si$ substrate by the well-known LOCOS planar or MESA isolation process.

The insulator is preferably $SiO_2$, but other insulators, such as sapphire, may be used.

After the Si device areas are isolated on the substrate, a thin oxide film is formed over the areas.

Next, the isolated silicon areas are implanted with n-type dopant ions to form an n-type channel region. A polysilicon layer is then deposited over the grown or coated thin oxide film. The polysilicon layer is then photolithographically etched to define an H-shaped polysilicon vertical control gate overlying the n-type Si channel region. The H-shaped vertical gate portions are formed in the shape of a transverse cross-piece portion with opposed end portions extending orthogonal to the cross-piece portion.

Next, $p^+$-type junction gate contact regions are formed by ion implantation in the Si underlying either side of the cross-piece portion of the polysilicon control gate using the control gate as a mask for ion implantation.

Next, again using the polysilicon control gate as a mask, $n^+$-type drain and source regions are formed by ion implantation on either side of the end portions of the control gate within the previously formed n-type channel region of the silicon islands. Preferably, thereafter, a passivating oxide layer is deposited over the devices to prevent "out diffusion" of implanted ions during subsequent heat treatment. The devices are then heat-treated to cause dopant activation, annealing of the implantation damage and, also, reflow of the passivating oxide layer.

Contact openings are then formed to the drain regions, source regions, junction gate regions and control gate regions.

Metallization is deposited to form the various contacts through the contact openings and, finally, appropriate interconnect patterns of metallization may be formed on the passivating oxide layer between isolated devices.

A lower control gate for the devices is formed by contact metallization applied to the bottom of the silicon substrate.

It may thus be seen, that unlike the prior art JFET SOI devices, in the apparatus of the present invention, two junction gate contacts are placed laterally on either side of the channel, instead of on top of the silicon island. Furthermore, a contact, which is isolated from the channel by an insulating layer $SiO_2$, is added vertically on top of the channel. This isolated contact, or electrode, is called the vertical control gate, or just the control gate, and may be used in conjunction with the second, or lower, vertical control gate to control the surface potential of the silicon thin film in the channel region.

Biasing these control gates allows the silicon channel region to be controlled for energy band bending (See pages 426–429 of *Physics of Semiconductor Devices*, S.M. Sze, Wiley-Interscience, Copyright 1969) for a description of energy band bending: flat band, accumulation and depletion conditions). Thus flat band, or accumulation conditions may be provided in the channel regions, according to, or depending upon the particular application of the JFET device.

Furthermore, the top vertical control gate functions as a mask for self-aligning the channel with the junction gate contacts, as well as the drain and source contacts, as described above.

As a member of the FET family, the above-described JFET, hereinafter called the gted self-aligned lteral jnction feld efect tansistor (GLJFET) may be used in digital circuits, in high input impedance amplifiers, and in microwave applications.

The GLJFET can be used in high current and high voltage applications, in which case, a control gate, preferably the upper vertical control gate, is biased such that the silicon film surface in the channel region is in accumulation, then the conductance of the channel region is increased. In addition, the low doped n- region added between the channel and the drain contact may be enlarged to increase the voltage breakdown.

In other applications of the GLJFET, the control gates are biased to set the silicon channel film surfaces in flat band conditions.

BRIEF DESCRIPTION OF THE DRAWINGS

FIG. 1 is a process flow diagram of the steps required for fabrication of the GLJFET of the invention.

DETAILED DESCRIPTION OF THE INVENTION

Referring now to FIGS. 1-8, the invention will be described in detail in connection therewith.

Figure 2:
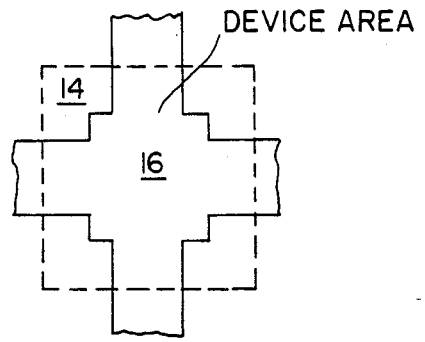
FIG. 2 is a plan view showing the device area isolation.
Figure 3:
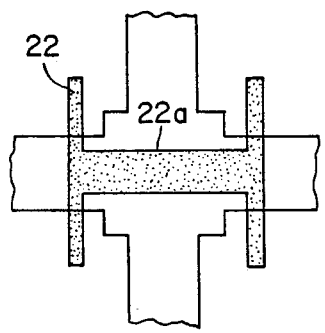
FIG. 3 is a plan view showing how the H-shaped junction control gate is formed over the device.
Figure 5:
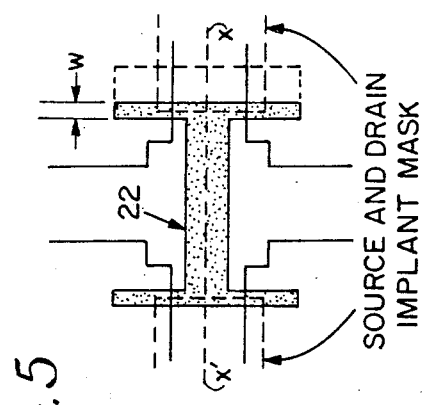
FIG. 5 is a plan view showing the source and drain n+ implant mask location.
Figure 7:
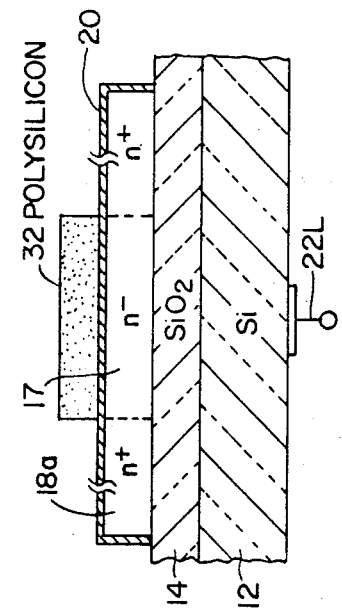
FIG. 7 is a cross-section taken along line X—X' of FIG. 5.
Figure 4:
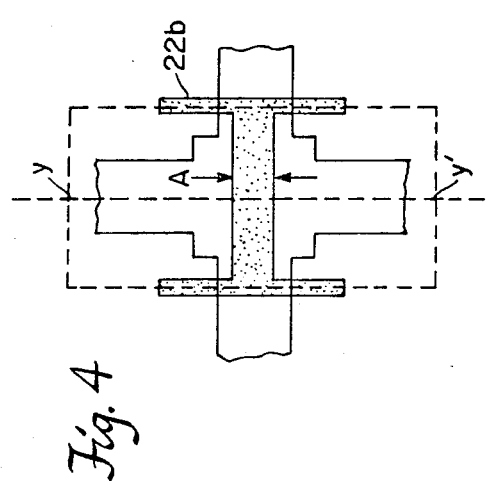
FIG. 4 is a plan view showing the location of the junction gate mask for p+ implant.
Figure 6:
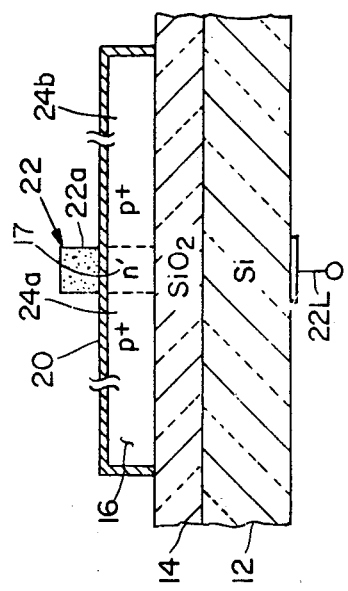
FIG. 6 is a cross-section taken along line Y—Y' of FIG. 4.
Figure 8:
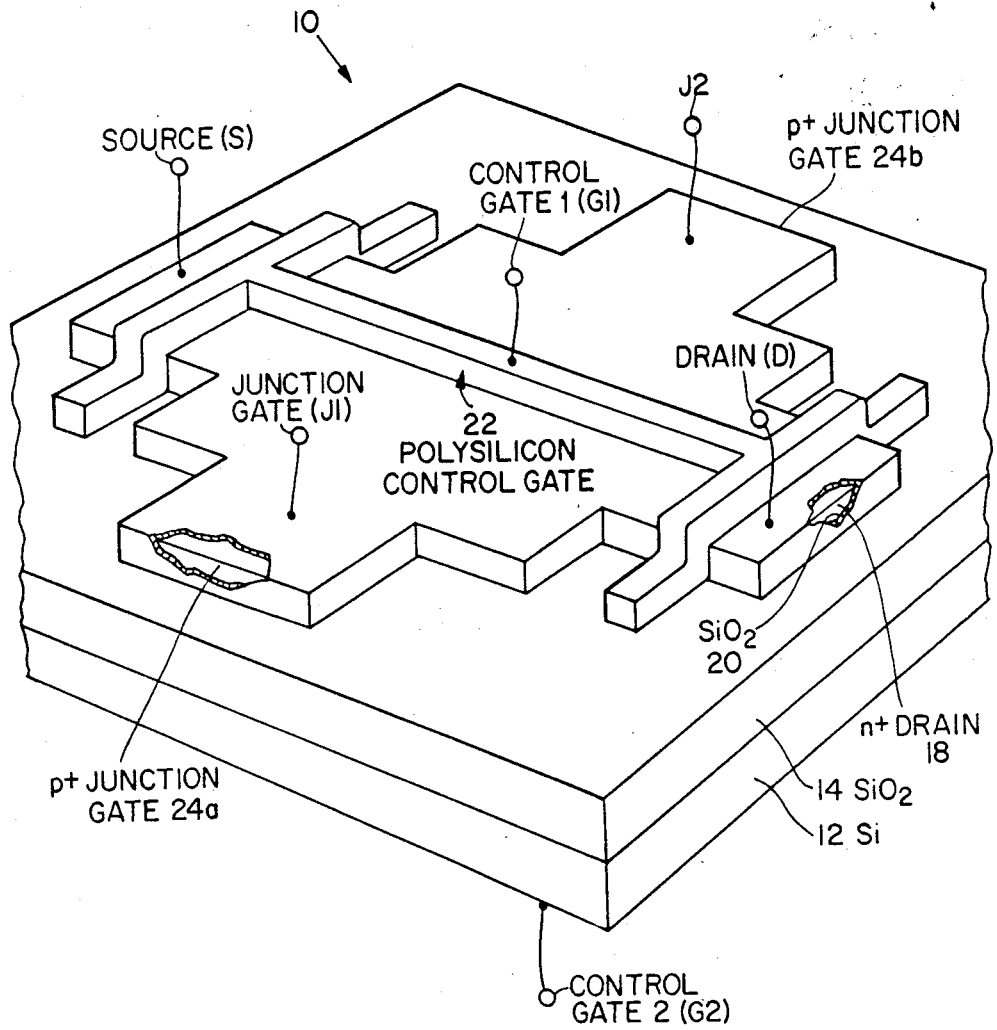
FIG. 8 is a perspective partially cut-away showing the structure prior to passivation oxide deposition with the contacts drawn schematically.

Prior to formation of the device a silicon-on-insulator substrate is provided. For example the SOI substrate may be provided by zone melt recrystallization of polysilicon formed on a $SiO_2$ insulator 14 on an Si substrate 12 (Step 1). The polysilicon is transformed to preferably single crystal or nearly single crystalline material 16. Device islands of silicon are isolated on the $SiO_2$ over Si substrate by either a LOCOS or MESA isolation process (Step 2). In the MESA isolation process, the Si layer of single crystal or nearly single crystalline material is etched down to the $SiO_2$ layer 14 using a suitable etchant. The plan view of FIG. 2 shows the island 16 in solid lines formed on top of the $SiO_2$ insulator 14. The channel implant mask in step 4 is shown by the dotted lines.

After the device islands 16 are formed, a thin oxide film 20 is formed over the islands. Next, the isolated silicon islands 16 are implanted with n-type dopant ions to form n-type channel regions within the silicon islands 16 (Step 4). The channel implant mask is shown in FIG. 2. A polysilicon layer is then deposited over the thin oxide 20 (Step 5). A polysilicon H-shaped structure is then photolithographically defined and etched into polysilicon. This structure forms a vertical control gate 22 overlying the n-type silicon channel region (Step 6). (Also see FIGS. 3 and 8). The H-shaped vertical gate 22 is formed with a transverse cross piece portion 22a and opposed end portions 22b extending orthogonal to the cross piece portion.

In the next step of the process, $p^+$-type junction gate contact regions 24a, b are formed in the silicon underlying either side of the cross piece portion 22a of the control gate using the polysilicon control gate 22 as a mask for ion implantation (Step 7).

In the next step, again using the polysilicon control gate 22 as a mask, $n^+$-type drain and source regions 18a and 18b, respectively, are formed by ion implantation on either side of the end portions 22b of the control gate 22 within the previously formed n-type channel regions of the silicon islands (Step 8).

Preferably thereafter, a passivating oxide layer (not shown) is grown over the entire device to prevent implanted ions from escaping (out diffusion) (Step 9). The devices 10 are heat treated to cause dopant activation, annealing of implantation damage and also reflow of the passivating oxide layer (Step 10). Contact openings, not shown, are then formed to the respective drain region, source region, junction gate regions, and control gate region (Step 11). A lower control gate 22L (See FIG. 6) is also formed by contact metallization applied to the bottom of a silicon substrate 12. Metallization is then deposited in the various upper contact openings to form contacts G1, G2, D, J1, J2, C shown schematically in FIG. 8. Appropriate interconnect patterns of metallization (not shown) may also be formed on the passivating oxide layer (not shown) to provide conductive continuity between isolated devices (Step 12). J1 and J2 are electrically tied together. Optionally, the width "w" of the polysilicon control gate 22b may be extended on the drain side as shown by dotted lines in FIG. 5 to increase voltage breakdown between the drain contact and the n-channel.

EQUIVALENTS

This completes the description of the preferred embodiments of the invention. While the invention has been particularly shown and described with reference to such embodiments, it should be understood that those skilled in the art will be capable of devising various changes in form and detail without departing from the spirit and scope of the invention.

For example, while specific n-type and p-type dopants have not been recited in the description, it should be clear that a great variety of such dopants exist. For example, suitable n-type dopants may comprise impurities, such as arsenic, antimony or phosphorus. Suitable p-type dopants may comprise materials, such as boron, boron flouride, or gallium.

In addition, while the device has been described in connection with the MESA isolation process, as previously noted, the islands may be isolated by the LOCOS process. Furthermore, while the device has been illustrated in connection with silicon-on-insulator, in which the insulator is $SiO_2$, other insulators, such as sapphire may be substituted in place thereof.

Lastly, in place of the polysilicon material for the control gate any metal or silicide with reasonable conductivity may be substituted. Polysilicon is a material of choice for its compatibility with CMOS processes.

I claim:

1. A JFET device formed on an island of Si over an insulator film over an Si substrate comprising:

(a) an n-channel region in said Si island having one cross portion and two end portions, said end portions extending orthogonal to said cross portion;

(b) n+ source and drain regions at opposite ends of the end portions of said n-channel region;

(c) p+ junction gate regions extending laterally from opposite sides of said cross-portion of said n-channel region; and (d) a first control gate extending over said channel region and separated from the n-channel region by an insulator and not extending over said junction gate regions, said first control gate being co-extensive with said n-channel region for controlling the surface potential in the n-channel region; and (e) a second control gate on said Si substrate beneath said channel region for controlling, in conjunction with said first control gate, the surface potential of the n-channel region.

2. A JFET device formed on a semiconductor island over an insulator comprising:

a channel semiconductor region of a first type of conductivity in said island and having a cross-portion with end portions extending in a direction orthogonal to said cross-portion;

source and drain regions of the same type of conductivity as the channel located on opposite ends of the end portions of the channel region;

junction gate regions having the opposite conductivity as that of the channel and that extend laterally from the cross-portion of said channel region between said source and drain regions; and a control gate extending over said channel region and co-extensive therewith and insulated therefrom.

3. The JFET device of claim 1 wherein the first control gate is formed of polysilicon.

4. The JFET device of claim 2 wherein the insulator is formed on an Si substrate and including an additional control gate located on the Si substrate beneath the channel region.

5. The JFET device of claim 2 wherein the control gate has an elongated longitudinally extending central portion and transverse portions with sides extending orthogonal to a center line through the longitude of said central portion.

6. The JFET device of claim 1 wherein the insulator is comprised of $SiO_2$.

7. The JFET device of claim 1 wherein the insulator is comprised of sapphire.

8. The JFET device of claim 2 wherein the control gate is formed of polysilicon.

* * * * *